United States Patent [19]

Le Roux et al.

[11] Patent Number: 5,212,448
[45] Date of Patent: May 18, 1993

[54] NMR PULSE SEQUENCE WITH BURST RF EXCITATION PULSES HAVING SEPARATELY CONTROLLED PHASE

[75] Inventors: Patrick L. Le Roux, Brookfield, Wis.; John M. Pauly, Menlo Park, Calif.

[73] Assignees: General Electric Company, Milwaukee, Wis.; The Board of Trustees of the Leland Stanford Junior University, Stanford, Calif.

[21] Appl. No.: 743,547

[22] Filed: Aug. 9, 1991

[51] Int. Cl.[5] .............................................. G01V 3/00
[52] U.S. Cl. ...................................... 324/309; 324/307
[58] Field of Search .............. 324/309, 307, 314, 312, 324/300; 128/653.1

[56] References Cited

U.S. PATENT DOCUMENTS

| | | | |
|---|---|---|---|
| 4,689,566 | 8/1987 | Maudsley | 324/309 |
| 4,710,718 | 12/1987 | Shaka | 324/309 |
| 4,914,392 | 4/1990 | Ugurbil et al. | 324/309 |
| 5,027,072 | 6/1991 | Rinaldi | 324/307 |

OTHER PUBLICATIONS

J. Hennig & M. Mueri, "Fast Imaging Using Burst Excitation Pulses", (1988), p. 238.
Pauly, Le Roux, & Macovski, "Parameter Relations for the Shinnar-Le Roux Selective Excitation Pulse Design Algorithm", (Mar. 1991), pp. 53-65.
Pauly, Nishimura & Macovski, "A k-Space Analysis of Small Tip Angle Excitation", (1988), pp. 1-11.

Primary Examiner—Louis Arana
Attorney, Agent, or Firm—Quarles & Brady

[57] ABSTRACT

An NMR system acquires data for producing an image using a spin-warp burst excitation pulse sequence. RF phase and flip-angle of each RF excitation pulse in the burst is separately controlled to maximize the SNR of the corresponding set of acquired NMR echo signals. The phase and amplitude of each acquired NMR echo signal is adjusted by an amount determined by its corresponding excitation pulse before being used for image reconstruction.

6 Claims, 3 Drawing Sheets

NMR PULSE SEQUENCE WITH BURST RF EXCITATION PULSES HAVING SEPARATELY CONTROLLED PHASE

BACKGROUND OF THE INVENTION

The field of the invention is nuclear magnetic resonance imaging methods and systems. More particularly, the invention relates to snapshot NMR imaging in which large amounts of image data is acquired in a single pulse sequence.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_O$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_O$, is determined by the magnitude of the transverse magnetic moment $M_t$. The amplitude, A, of the emission signal decays in an exponential fashion with time, t:

$$A = A_O e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_O$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or a spin-echo signal.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There are a number of known methods for significantly reducing the total scan time and which are referred to very generally as "fast" imaging. One such known method reduces scan time by significantly reducing the repetition time of each pulse sequence in the scan. Whereas conventional pulse sequences have repetition times TR which are greater than the spin-spin relaxation constant $T_2$ so that the transverse magnetization has time to relax between the RF excitation pulse in each sequence, fast pulse sequences have a much shorter repetition time TR. One such fast pulse sequence which is known in the art as "GRASS" is described in U.S. Pat. No. 4,665,365;

and another such fast pulse sequence which is known as "SSFP-ECHO" is described by R. C. Hawkes and S. Patz in an article entitled "Rapid Fourier Imaging Using Steady-State Free Precession," published in *Magnetic Resonance in Medicine* 4, pp. 9-23 (1987).

A second method for significantly reducing scan time is to employ a pulse sequence in which more than one NMR signals is acquired. One such pulse sequence is the echo-planar pulse sequence which was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan or "snapshot," of 64 views can be acquired in a single pulse sequence of 20 to 100 milliseconds in duration. The advantages of echo-planar imaging ("EPI") are well-known, and a number of different echo-planar pulse sequences are disclosed in U.S. Pat. No. 4,678,996; 4,733,188; 4,716,369; 4,355,282; 4,588,948 and 4,752,735.

Another fast imaging method which produces a plurality of NMR signals during each pulse sequence employs a burst of RF excitation pulses. Each RF excitation pulse in the burst has a low flip-angle and each RF excitation pulse produces a corresponding spin-echo NMR signal. This burst RF excitation sequence is an improvement over the EPI sequence in that it avoids the eddy-current and noise problems associated with the ultra fast gradient switching required by the EPI sequence. However, because the flip-angle of each RF excitation pulse in the burst is low, the signal-to-noise ratio (SNR) of the resulting NMR spin-echo signal is also very low. Indeed, the SNR of prior burst excitation pulse sequences is 1/N that of the EPI pulse sequence, where N is the number of RF excitation pulses in the burst. For example, in a 64 pulse burst with a flip-angle of 1.5 degrees for each pulse, the SNR is only 1/64 of the SNR of a corresponding EPI pulse sequence. The diagnostic usefulness of an image reconstructed from such data is thus significantly reduced.

SUMMARY OF THE INVENTION

The present invention is an improved NMR burst excitation pulse sequence in which the SNR of the acquired signals is significantly improved. More specifically, by controlling the flip-angle and phase of the separate RF excitation pulses in the burst, the SNR of the acquired NMR signals can be increased to a value which is $1/\sqrt{N}$ of the corresponding EPI pulse sequence. The resulting separately acquired NMR signals are adjusted in phase and amplitude by an amount which offsets the phase and flip-angle of its corresponding RF excitation pulse before being used to reconstruct an image.

The set of burst pulses are modeled as a sequence of hard RF subpulses separated by gradient field pulses. The ideal set of burst pulses tips all the magnetization ($M_O$) into the transverse plane ($M_{xy}$), but leaves it phase encoded so that N separate and equal amplitude NMR echo signals can be recalled. The desired transverse magnetization may be expressed as:

$$M_{xy}(x) = 2A_n^*(z) B_n(z),$$

where $A_n(z)$ and $B_n(z)$ are polynomials produced by the forward Shinnar-Le Roux transform described in the *Journal of Magnetic Resonance*, 81, 43, 1989 and *Proceedings VII SMRM*, p. 653, 1988 and where $$z = e^{i\gamma G_x \Delta T}$$

For excitation pulses the coefficients of the polynomial $A_n(z)$ essentially form a delta function, so the transverse magnetization $M_{xy}$ is primarily determined by the polynomial $B_n(z)$. The coefficients of $B_n(z)$ are in turn proportional to the amplitude and phase of the desired NMR echo signals. The ideal set of burst pulses can be achieved, therefore, by calculating the coefficients of the polynomial $B_n(z)$ such that they have relatively constant magnitude and arbitrary phase, and the polynomial itself has constant magnitude when evaluated along the unit circle in the complex z-plane.

A general object of the invention is to improve the SNR of NMR signals acquired with a burst excitation pulse sequence. By separately controlling the flip-angle and phase of each pulse in the burst, the SNR of the resulting NMR signals is increased from 1/N to $1/\sqrt{N}$ the SNR of a corresponding EPI pulse sequence. In a 64 pulse burst, for example, this is an 8 times improvement in SNR.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
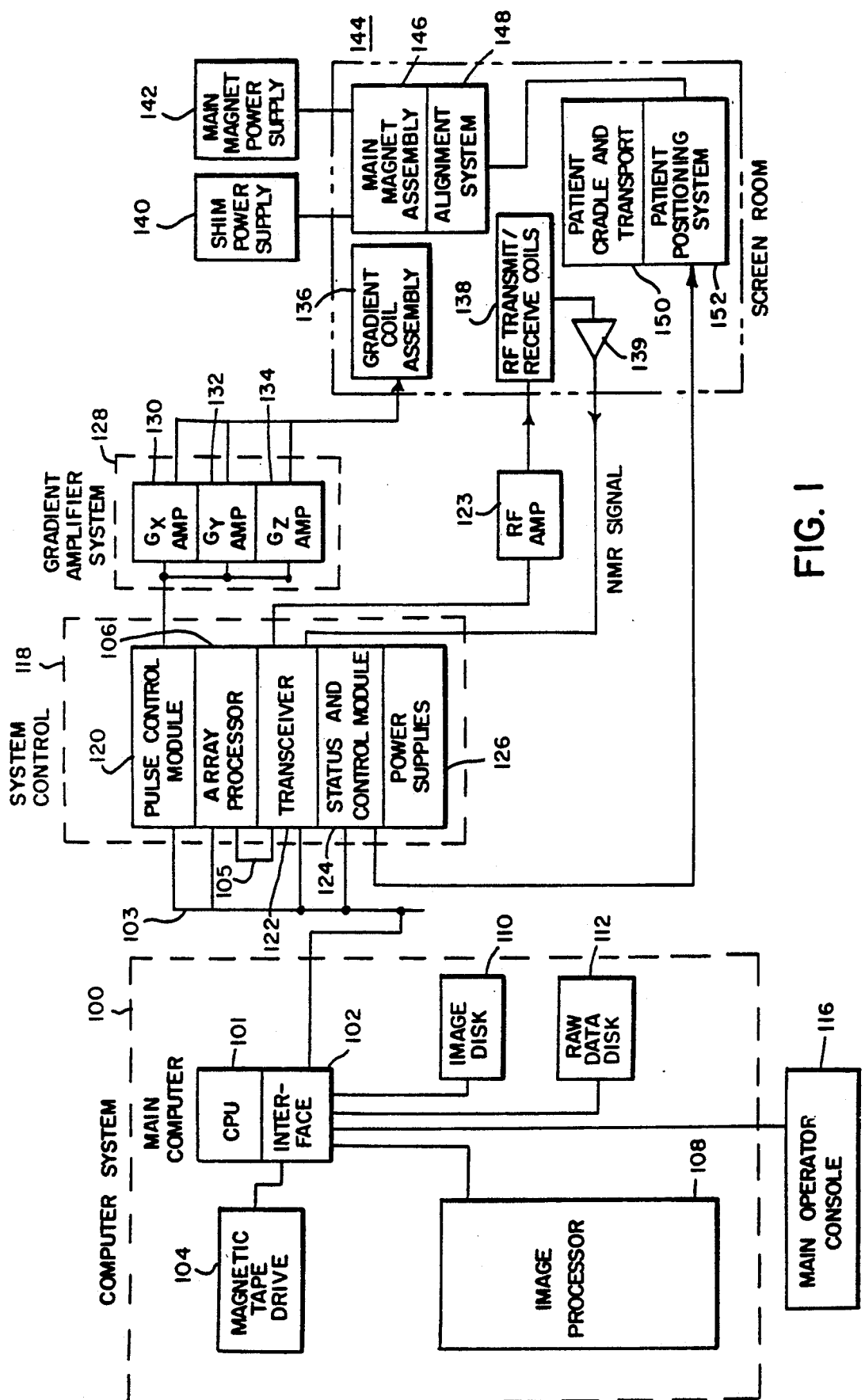
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_O$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
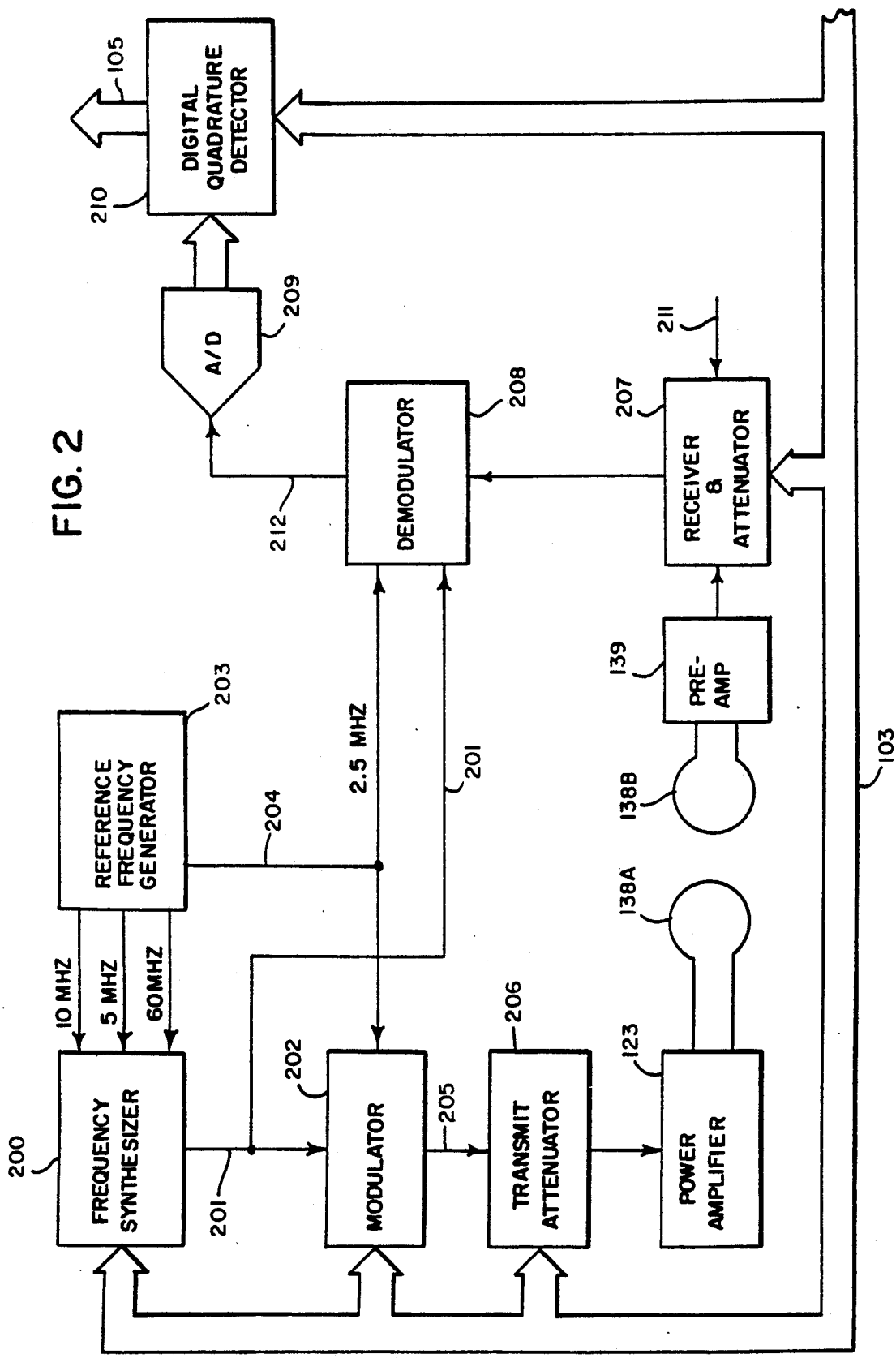
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

To practice the present invention a series of RF excitation pulses are produced as will be described in more detail below. The amplitude and duration of each RF pulse in this burst is controlled by the signal R(t) which is played out as the RF carrier is generated to produce a set of equally spaced and equal duration RF excitation pulses. The RF phase of each pulse in the burst is separately controlled by the signal CF.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
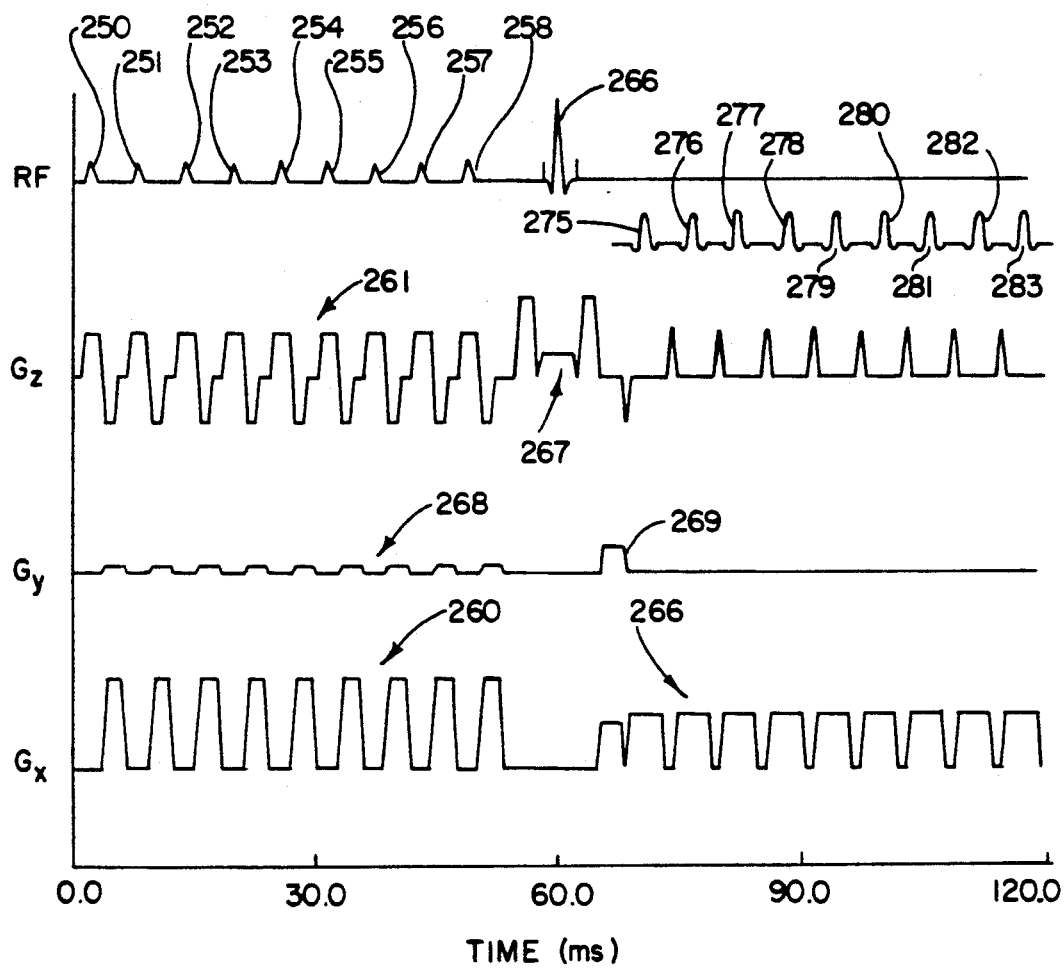
FIG. 3 is a graphic representation of a pulse sequence executed by the NMR system of FIG. 1 to practice the present invention.

A pulse sequence which employs a preferred embodiment of the invention is shown in FIG. 3. This pulse sequence employs a nine-pulse burst for late-echo $T_2$ weighted spin warp imaging. Each pulse sequence enables nine rows of NMR data to be acquired, so that a 256 by 256 pixel image is acquired by repeating the pulse sequence 28 times. With a pulse repetition rate (Tr) of 2000 milliseconds, all the data for the image can thus be acquired in less than one minute.

The pulse sequence is characterized by a burst of RF excitation comprised of nine pulses 250–258 which are produced in the presence of a $G_x$ readout gradient 260. The RF pulses 250–258 are selective and a corresponding series of $G_z$ slice select gradient pulses 261 are produced along with their negative rephasing lobes to produce transverse magnetization ($M_{xy}$) in a slice disposed in the selected x-y plane.

A set of nine NMR echo signals 275–283 are recalled by a selective 180° RF echo pulse 266. The nine NMR echo signals are separately acquired in the presence of a $G_x$ readout gradient 266 which frequency encodes each acquired NMR echo signal 275–283. The RF echo pulse 266 is selective and is produced in the presence of a $G_z$ slice select gradient pulse 267 in the usual fashion.

A set of $G_y$ phase encoding pulses 268 are produced between successive RF excitation pulses 250–258 to encode the acquired NMR echo signals with spatial information along the y axis. A $G_y$ rewinder pulse 269 is produced after the echo pulse 266 and before the data acquisition begins. The pulse sequence is in essence a spin-warp sequence in which nine separate NMR echo signals are acquired to provide the data for nine rows in the k-space data array. The pulse sequence of FIG. 3 is executed 28 times to provide all the k-space data, with the phase encoding $G_y$ gradient pulses 268 and 269 being incremented to a different level after each pulse sequence to acquire all of the data along the $k_y$ direction.

It is a teaching of the present invention that the SNR of the acquired NMR echo signals can be significantly improved by separately controlling the flip-angle (nutation) and RF phase of each RF excitation pulse 250–258 in the burst. As a result, the SNR can be improved from a value of 1/N to a value of $1/\sqrt{N}$ of the SNR of a corresponding EPI pulse sequence. In the preferred pulse sequence of FIG. 3 where N=9, this is a three times improvement in SNR.

Applying these teachings to the pulse sequence of FIG. 3, the transceiver 122 (FIG. 2) is operated during the burst of RF excitation to produce the following nine selective RF excitation pulses:

| Pulse | Flip-Angle | RF Phase |
|-------|------------|----------|
| 250   | 37         | −45      |
| 251   | 34         | −45      |
| 252   | 28         | 18       |
| 253   | 24         | 0        |
| 254   | 35         | −130     |
| 255   | 24         | 180      |
| 256   | 28         | 18       |
| 257   | 34         | 135      |
| 258   | 38         | −45      |

In the alternative, a similar result can be achieved with the following nine, selective RF excitation pulses:

| Pulse | Flip-Angle | RF Phase |
|-------|------------|----------|
| 250   | 37         | 45       |
| 251   | 34         | −45      |
| 252   | 28         | 162      |
| 253   | 25         | 89       |
| 254   | 35         | 130      |
| 255   | 25         | 89       |
| 256   | 28         | 162      |
| 257   | 34         | −45      |
| 258   | 37         | 45       |

Figure 4:
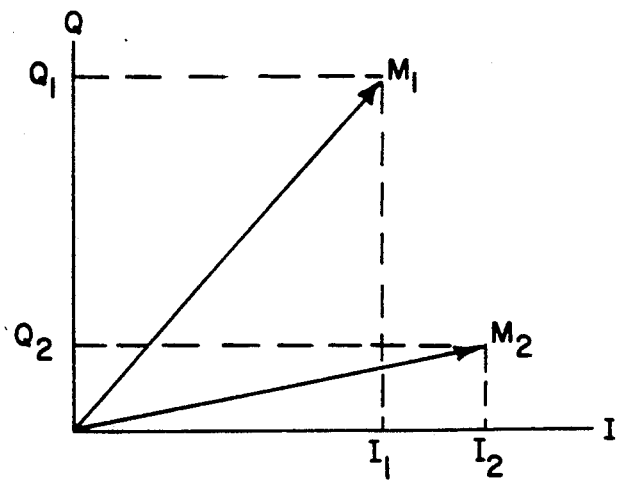
FIG. 4 is a vector diagram used to explain the adjustment made to the NMR signals acquired with the pulse sequence of FIG. 3.

On the receiver side, the NMR echo signals 275–283 are received in the reverse order. In other words, the transverse magnetization which is refocused to produce the first NMR echo signal 275 was tipped into the transverse plane by the last RF pulse 258 in the burst, and the last NMR echo signal 283 is attributable to the transverse magnetization produced by the first RF excitation pulse 250. Accordingly, before reconstructing an image with the NMR echo signal data acquired according to the present invention, the phase and amplitude of the data must be adjusted to compensate for the differing phase and flip-angles used to produce the data. Referring particularly to FIG. 4, this adjustment is made by rotating the vector $M_1$ formed by the acquired in-phase and quadrature values ($I_1$ and $Q_1$) of the NMR echo signal to offset the phase angle imposed on the magnetization by its corresponding RF excitation pulse. For example, the data points acquired from the last NMR echo signal 283 are rotated $+45°$ to offset the $-45°$ phase an their corresponding RF excitation pulse 250. Similarly, the magnitude of the vector $M_1$ is adjusted to reflect the fact that the flip-angles are different for each RF excitation pulse. The resulting rotated and scaled vector $M_2$ is stored back in the data array as in-phase and quadrature values ($I_2$ and $Q_2$) which are then used in the image reconstruction process. In the preferred embodiment, the image reconstruction is accomplished by performing a two-dimensional Fourier transformation on the 256 by 256 array of adjusted, complex NMR data.

The present invention teaches that the flip-angle and RF phase of the RF excitation pulses in a burst sequence can be separately controlled to significantly improve the SNR of the acquired data. Prior to reconstructing an image from the acquired data, however, it must be adjusted in phase and amplitude to reflect the fact that it was produced from RF excitation pulses of widely varying phase and different flip-angles.

We claim:

1. In an NMR system for producing images from a set of separately acquired NMR signals, a burst excitation pulse sequence for acquiring a plurality of separate NMR signals which comprises:

producing an RF excitation burst comprised of a series of separate RF excitation pulses each having a separately controlled RF phase;

producing a readout magnetic field gradient during the RF excitation burst;

producing a series of separate NMR signals, each corresponding to one of the RF excitation pulses;

producing a readout magnetic field gradient during the production of the NMR signals;

separately acquiring each NMR signal in the series;

adjusting the phase of each acquired NMR signal by an amount determined by the phase of its corresponding RF excitation pulse; and reconstructing an image from the adjusted NMR signals.

2. The NMR system as recited in claim 1 in which the flip-angle of each RF excitation pulse in the burst is separately controlled and the amplitude of each acquired NMR signal is adjusted by an amount determined by the flip-angle of its corresponding RF excitation pulse.

3. The NMR system as recited in claim 1 in which each RF excitation burst has nine separate RF excitation pulses and a series of nine separate NMR signals are produced.

4. The NMR system as recited in claim 3 in which the RF phase of the successively produced RF excitation pulses is substantially $-45°$, $-45°$, $18°$, $0°$, $-130°$, $180°$, $18°$, $135°$ and $-45°$.

5. The NMR system as recited in claim 1 in which the series of NMR signals are echo signals produced by an RF echo pulse.

6. The NMR system as recited in claim 3 in which the RF phase of the successively produced RF excitation pulses is substantially $45°$, $-45°$, $162°$, $89°$, $130°$, $89°$, $162°$, $-45°$, and $45°$.

* * * * *